US008606194B2

(12) United States Patent
Kaukovuori et al.

(10) Patent No.: US 8,606,194 B2
(45) Date of Patent: Dec. 10, 2013

(54) RECEIVER

(75) Inventors: Jouni Kristian Kaukovuori, Vantaa (FI); Aarno Tapio Parssinen, Espoo (FI); Antti Oskari Immonen, Helsinki (FI)

(73) Assignee: Renesas Mobile Corporation, Tokyo (JP)

( * ) Notice: Subject to any disclaimer, the term of this patent is extended or adjusted under 35 U.S.C. 154(b) by 113 days.

(21) Appl. No.: 13/209,793

(22) Filed: Aug. 15, 2011

(65) Prior Publication Data

US 2013/0045704 A1    Feb. 21, 2013

(51) Int. Cl.
*H04B 1/40* (2006.01)
*H04B 1/26* (2006.01)
*H03D 7/08* (2006.01)

(52) U.S. Cl.
CPC . *H04B 1/405* (2013.01); *H03D 7/08* (2013.01)
USPC ....... 455/76; 455/132; 455/196.1; 455/226.2; 455/255; 455/323

(58) Field of Classification Search
USPC ............ 455/76, 77, 132, 165.1, 196.1, 226.2, 455/229, 323, 553.1
See application file for complete search history.

(56) References Cited

U.S. PATENT DOCUMENTS

| | | | | |
|---|---|---|---|---|
| 5,222,255 A * | 6/1993 | Kuo et al. | ...................... | 455/266 |
| 5,307,515 A * | 4/1994 | Kuo et al. | ...................... | 455/295 |
| 5,790,587 A * | 8/1998 | Smith et al. | ...................... | 375/147 |
| 5,881,369 A * | 3/1999 | Dean et al. | ...................... | 455/78 |
| 5,983,081 A * | 11/1999 | Lehtinen | ......................... | 455/76 |
| 6,609,010 B1 * | 8/2003 | Dolle et al. | ................. | 455/552.1 |
| 7,212,793 B2 * | 5/2007 | Kogawa et al. | ............... | 455/132 |
| 7,715,814 B2 * | 5/2010 | Manku et al. | ................. | 455/296 |
| 7,881,688 B1 * | 2/2011 | He | .................... | 455/296 |
| 2008/0051053 A1 * | 2/2008 | Fedan | ........................... | 455/296 |
| 2011/0081880 A1 | 4/2011 | Ahn | | |
| 2011/0122972 A1 | 5/2011 | Lie et al. | | |
| 2011/0122974 A1 * | 5/2011 | Sundstrom et al. | .......... | 375/316 |
| 2011/0136455 A1 * | 6/2011 | Sundstrom et al. | ........ | 455/196.1 |

OTHER PUBLICATIONS

"$3^{rd}$ Generation Partnership Project; Technical Specification Group Radio Access Network; Evolved Universal Terrestrial Radio Access (E-UTRA); User Equipment (UE) radio transmission and reception; (Release 10)", 3GPP TR 36.807, V0.1.0, Aug. 2010, 94 pgs.

* cited by examiner

*Primary Examiner* — Duc M Nguyen
(74) *Attorney, Agent, or Firm* — Stanton IP Law

(57) ABSTRACT

Embodiments provide a receiver and a method for receiving data transmitted via a combination of a first signal modulated at a first carrier frequency, and a second signal modulated at a second carrier frequency, different to the first carrier frequency.

In one embodiment the receiver includes a local oscillator and is configured to adaptively configure the local oscillator to operate at a first local oscillator frequency and a second local oscillator frequency, different to the first frequency, in dependence on a signal strength of the first signal relative to a signal strength of the second signal.

22 Claims, 13 Drawing Sheets

RECEIVER

TECHNICAL FIELD

The present invention relates to receivers for radio communication systems, and in particular to receivers for use with contiguous carrier aggregation schemes.

BACKGROUND

Long Term Evolution (LTE) Advanced is a mobile telecommunication standard proposed by the $3^{rd}$ Generation Partnership Project (3GPP) and first standardised in 3GPP Release 10. In order to provide the peak bandwidth requirements of a $4^{th}$ Generation system as defined by the International Telecommunication Union Radiocommunication (ITU-R) Sector, while maintaining compatibility with legacy mobile communication equipment, LTE Advanced proposes the aggregation of multiple carrier signals in order to provide a higher aggregate bandwidth than would be available if transmitting via a single carrier signal. This technique of Carrier Aggregation (CA) requires each utilised carrier signal to be demodulated at the receiver, whereafter the message data from each of the signals can be combined in order to reconstruct the original data. Carrier Aggregation can be used also in other radio communication protocols such as High Speed packet Access (HSPA).

FIG. 1 illustrates two main variations of CA on frequency-amplitude graph 100. The graph areas 102, 104, 106 and 108 are representative of signals modulated at carrier frequencies $f_{C1}$, $f_{C2}$, $f_{C3}$ and $f_{C4}$ respectively. Carrier frequencies $f_{C1}$, $f_{C2}$, $f_{C3}$ and $f_{C4}$ are associated with a set of adjacent channels used in a communication scheme, such as LTE, which has been assigned for use in the displayed section of the frequency spectrum. Each communication channel may be separated by guard bands, which are small unused sections of the frequency spectrum designed to improve the ease with which individual signals can be selected by filters at the receiver by reducing the likelihood of interference between signals transmitted in adjacent channels.

In a first communication instance, data is transmitted to a user terminal using the aggregation of signals 102 and 104 modulated at carrier frequencies $f_{C1}$ and $f_{C2}$ respectively. This is an example of contiguous CA, where data is transmitted at carrier frequencies that are adjacent in the frequency spectrum. In a second communication instance, data is transmitted to a user terminal using the aggregation of signals 106 and 108 modulated at carrier frequencies $f_{C3}$ and $f_{C4}$ respectively. This is an example of non-contiguous CA, where data is transmitted at carrier frequencies that are separated by one or more intermediate carrier frequencies (in this case $f_{C1}$ and $f_{C2}$) not used in the communication instance. In some non-contiguous CA arrangements, the aggregated signals may be in entirely different frequency bands.

Several radio communication schemes, including LTE, use quadrature modulation to increase the data density of a single frequency channel by transmitting a second message which is modulated with a carrier that is 90° out of phase with respect to a first message. These two message components are termed the in-phase (I) and quadrature (Q) components respectively. A common method for processing a quadrature modulated signal uses a receiver arrangement known as a Direct Conversion Receiver (DCR).

FIG. 2 illustrates a schematic diagram of an exemplary DCR as known in the art. A wide range of radio communication signals are received at antenna 200, which is tuned by a wide bandwidth pre-selection filter 202. The filtering behaviour of pre-selection filter 202 may arise out of the physical and electromagnetic characteristics of the antenna design, perhaps due to optimisation for the frequency band of the desired telecommunication application. Pre-selection filter 202 may also include one or more tuned circuits, which are used to remove frequency components of the input that are far outside the intended range of reception frequencies. The received signal is typically of very small amplitude, and requires amplification by low noise amplifier 204 before further processing can be performed. Low noise amplifier 204 must operate at high frequencies (at least the transmission frequency of the signal the receiver is intended to receive), commonly referred to as radio frequency, and also provide very low noise insertion due to the weakness of the incoming signal.

In order to select the appropriate signal from the many signals received at antenna 200, the received input must be filtered. However, the high selectivity of the filter profile that would be required to isolate one signal at radio frequency makes filtering at this stage either unrealistic (given the manufacturing tolerances of commonly available components) or undesirably expensive. Hence, before signal selection can occur, the frequency of the desired signal must be down-converted by mixing the input signal with a signal generated by local oscillator 206. A direct conversion receiver converts the desired signal directly to baseband frequency by mixing it with a local oscillator signal of the same frequency as the carrier frequency of the desired signal. This has the effect of translating the desired signal to be centred on zero frequency, as described in further detail below with respect to FIG. 3.

In order to extract both the I and Q components, the input signal must be mixed with both in-phase and quadrature shifted versions of the local oscillator signal, which are generated by quadrature generator 208. The exact phase of the received signal cannot be predicted due to the unknown phase shift that will occur during transmission. Hence, the local oscillator must synchronise with the received signal in order to ensure the necessary phase relationship. This synchronisation may be achieved by establishing a phase reference, for example by using a phase locked loop (PLL) or by rotating the signal after down-conversion by digital means. The input signal is mixed with the in-phase local oscillator signal by mixer 210, and with the quadrature phase local oscillator signal by mixer 212. Mixers 210 and 212 perform multiplication between the input signal and the appropriate local oscillator signal in order to achieve the required frequency down-conversion.

The desired I and Q components can then be isolated using low pass filters 214 and 216 respectively, which are used to suppress unwanted frequencies associated with signals adjacent in adjacent channels etc. Finally, Analogue to digital converters (ADCs) 218 and 220 convert the I and Q components into binary representations of the I and Q message data 222 and 224. Once in the digital domain, further processing can be performed on the I and Q data, including recombination of the components to form the original data message.

With minimal modification, a DCR can also be used to receive a specific CA configuration, defined in 3GPP TR 36.807 as Carrier Aggregation bandwidth class C, which involves the aggregation of two adjacent frequency channels. Signals 102 and 104 of FIG. 1 are an example of CA according to such a configuration.

FIG. 3 illustrates the operation of conventional DCR hardware when used to receive data transmitted via two adjacent signals on frequency-amplitude graph 300. Signals 302 and 304 are modulated at carrier frequencies $f_{C1}$ and $f_{C2}$ respectively and used in a contiguous CA configuration. Mixing a signal having carrier frequency $f_C$ with a local oscillator signal of frequency $f_{LO}$ has the effect of translating the signal to be centred on new frequencies at $f_{LO}-f_C$ and $f_{LO}+f_C$. Frequency down-conversion as preformed in receiver circuits utilises the signal translated at $f_{LO}-f_C$. By mixing the input with local oscillator signal 306 having a frequency halfway between $f_{C1}$ and $f_{C2}$, signals 302 and 304 are both frequency down-converted and translated to become centred on the same frequency.

Signal 302 is translated to be centred on frequency $f_{LO}-f_{C1}$ as shown by arrow 308. Signal 304 is translated to be centred on frequency $f_{LO}-f_{C2}$ which is the same as $-(f_{C2}-f_{LO})$, where the negative sign indicates a 180° phase shift. Hence signal 304 is phase inverted and translated to be centred on frequency $f_{C2}-f_{LO}$ which, due to the choice of frequency of the local oscillator signal 306, is equivalent to $f_{LO}-f_{C1}$, as shown by arrow 310. The result of these translations is to generate a composite signal 312 made up of signal 302 and a phase inverted signal 304 centred on frequency $f_{LO}-f_{C1}$. The DCR hardware then acts as a low intermediate frequency (IF) receiver for both carriers in order to produce a combined I component of both signals and a combined Q component of both signals. The individual I and Q components of each signal can then be isolated in subsequent processing due to the phase inversion between them, for example by performing a Fourier Transform operation, and the original data can be reconstructed from the four message components.

Problems arise when the signal strengths of the two signals arriving at the receiver are substantially different. This could occur for several reasons, for example due to the different propagation characteristics of the different frequency carrier waves. Further, different carrier frequencies may be associated with different cell coverage areas and different transmitter directivity. Additionally, the coverage of one of the frequencies could be augmented through the provisioning of frequency selective repeaters, thereby raising the signal strength of one signal relative to the other.

FIG. 4 illustrates the operation of conventional DCR hardware when used to receive data transmitted via two adjacent signals having a relative signal strength imbalance on frequency amplitude graph 400. Adjacent signals 402 and 404 are modulated at carrier frequencies $f_{C1}$ and $f_{C2}$ respectively; however when received at the receiver, the signal strength of signal 402 is significantly lower than the signal strength of signal 404. As described above, when mixed with local oscillator signal 406 of frequency $f_{LO}$, both signals are frequency down-converted and translated to be centred on frequency $f_{LO}-f_{C1}$ as shown by arrows 408 and 410.

The result of these translations is to generate a composite signal 412 made up of signal 402 and a phase inverted signal 404 centred on frequency $f_{LO}-f_{C1}$. Due to imperfections such as component mismatch in the mixer and low pass filter hardware, or the quality of quadrature signals from the local oscillator, the image-reject ratio (IRR) of the receiver for isolating the I and Q components of the combined signal will not be infinite. As the signal strength imbalance between the two signals increases, a higher receiver I-Q performance is required in order to successfully isolate the signal components. Due to these imperfections, there is a limit to the signal strength imbalance between two contiguous CA carriers that can be successfully processed by a single conventional DCR receiver path, after which the translated relatively low strength signal is overpowered by the presence of the relatively higher strength one.

FIG. 5 schematically illustrates an alternative known hardware arrangement for receiving data transmitted via two adjacent signals having a relative signal strength imbalance. In FIG. 5, a dedicated receiver path is provided for the reception of each of the two CA signals. A first receiver path contains antenna 500; pre-selection filter 502; low-noise amplifier 504; local oscillator 506; quadrature generator 508; mixers 510 and 512; low-pass filters 514 and 516; and ADCs 518 and 520. A second receiver path contains antenna 500; pre-selection filter 502; low-noise amplifier 526; local oscillator 528; quadrature generator 530; mixers 532 and 534; low-pass filters 536 and 538; and ADCs 540 and 542. The operation of antenna 500; pre-selection filter 502; low-noise amplifiers 504 and 526; quadrature generators 508 and 530; mixers 510, 512, 532 and 534; low-pass filters 514, 516, 536 and 538; and ADCs 518, 520, 540 and 542; are the same as described previously in relation to FIG. 2. However, local oscillators 506 and 528 are configured to produce different frequencies by operating at the carrier frequency of the signal intended to be processed by their respective paths. In this manner, the two receiver paths operate as two individual DCRs, one arranged to receive each carrier signal.

Due to the use of independently configurable local oscillators, this method is more commonly used for non-contiguous carrier aggregation, where the two signals may be transmitted at very different carrier frequencies and the single DCR operating as a low-IF receiver as described previously is not appropriate. However, when applied to a contiguous carrier aggregation configuration, the two local oscillators must operate at very similar frequencies. In single integrated circuit deployments, the configuration may suffer from local oscillator pulling due to difficulties in sufficiently isolating the two local oscillators from one another. The effect of this is to cause instabilities in the generated signals as the two operating frequencies tend towards each other, thereby impeding the successful operation of the receiver. Further, this arrangement has increased silicon area and power consumption costs when compared to the single DCR arrangement described with reference to FIG. 2, which make it a less desirable solution. Hence, it is an objective of the present invention to provide improved receiver hardware, capable of effectively receiving data transmitted via aggregated carrier signals.

SUMMARY

In accordance with exemplary embodiments of the present invention, there is provided a receiver, and a method for configuring a receiver, to receive data transmitted via a combination of a first signal modulated at a first carrier frequency, and a second signal modulated at a second carrier frequency, different to the first carrier frequency according to the appended claims.

In one exemplary embodiment the receiver comprises a local oscillator and is configured to adaptively configure the local oscillator to operate at a first local oscillator frequency and a second local oscillator frequency, different to the first frequency, in dependence on a signal strength of the first signal relative to a signal strength of the second signal.

In another exemplary embodiment the method comprises identifying a first signal strength corresponding to the first signal, identifying a second signal strength corresponding to the second signal, and configuring a local oscillator to adaptively operate at a first local oscillator frequency and a second local oscillator frequency, different to the first frequency, in dependence on the identified first signal strength relative to the identified second signal strength.

Further features and advantages of the invention will become apparent from the following description of preferred embodiments of the invention, given by way of example only, which is made with reference to the accompanying drawings.

DETAILED DESCRIPTION

Embodiments of the present invention provide a receiver capable of receiving carrier aggregated data transmitted via two carrier signals having a relative signal strength imbalance by adaptively reconfiguring a local oscillator frequency in dependence on the nature of the signal strength imbalance between the two signals.

In one exemplary embodiment the receiver comprises a local oscillator and is configured to adaptively configure the local oscillator to operate at a first local oscillator frequency and a second local oscillator frequency, different to the first frequency, in dependence on a signal strength of the first signal relative to a signal strength of the second signal.

In another exemplary embodiment the method comprises identifying a first signal strength corresponding to the first signal, identifying a second signal strength corresponding to the second signal, and configuring a local oscillator to adaptively operate at a first local oscillator frequency and a second local oscillator frequency, different to the first frequency, in dependence on the identified first signal strength relative to the identified second signal strength.

Figure 3:
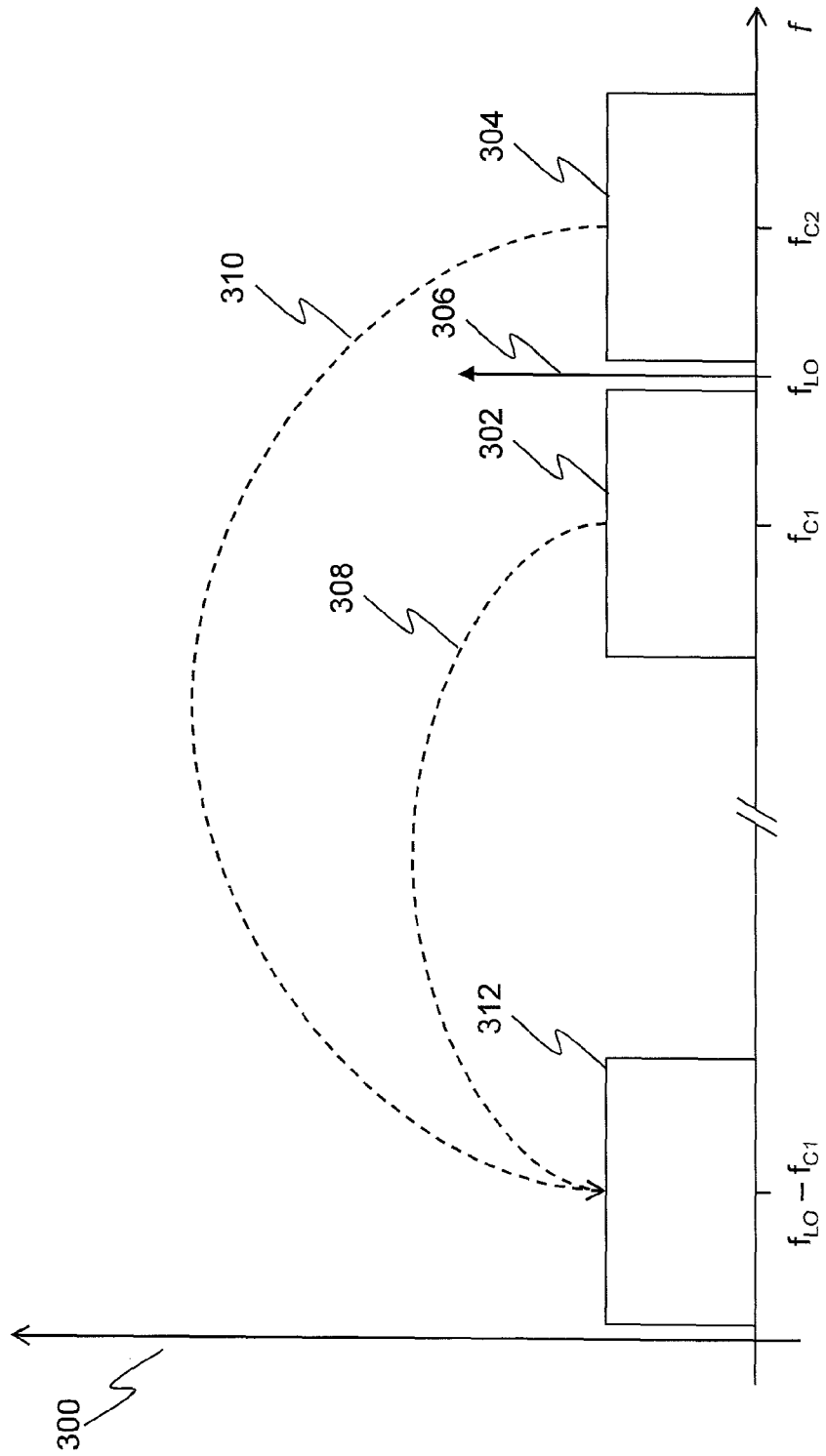
FIG. 3 shows a frequency-amplitude graph illustrating the operation of a conventional receiver when used as a low-IF receiver to receive data transmitted via two adjacent signals.
Figure 4:
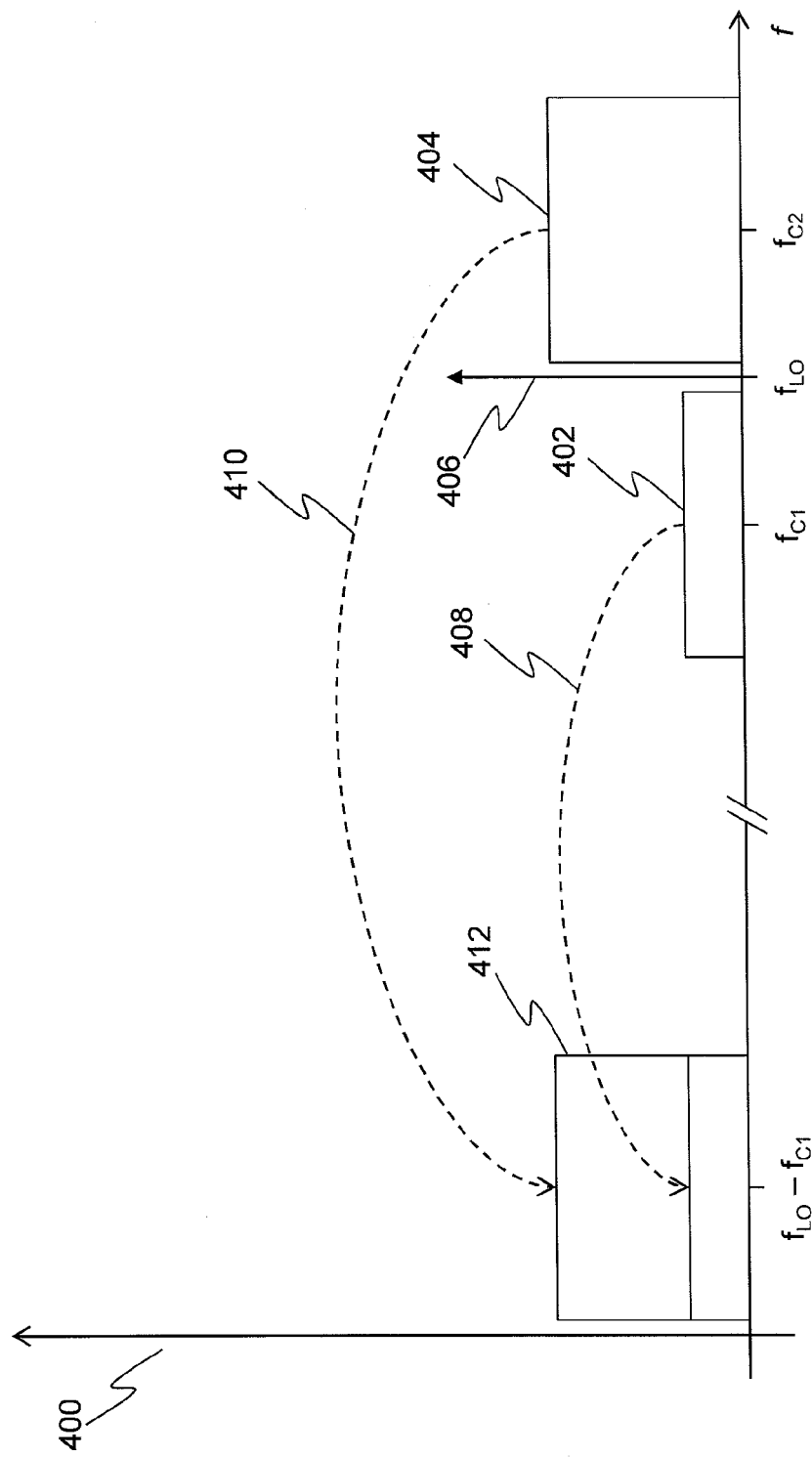
FIG. 4 shows a frequency-amplitude graph illustrating the operation of a conventional receiver when used as a low-IF receiver to receive data transmitted via two adjacent signals having a relative signal strength imbalance.
Figure 5:
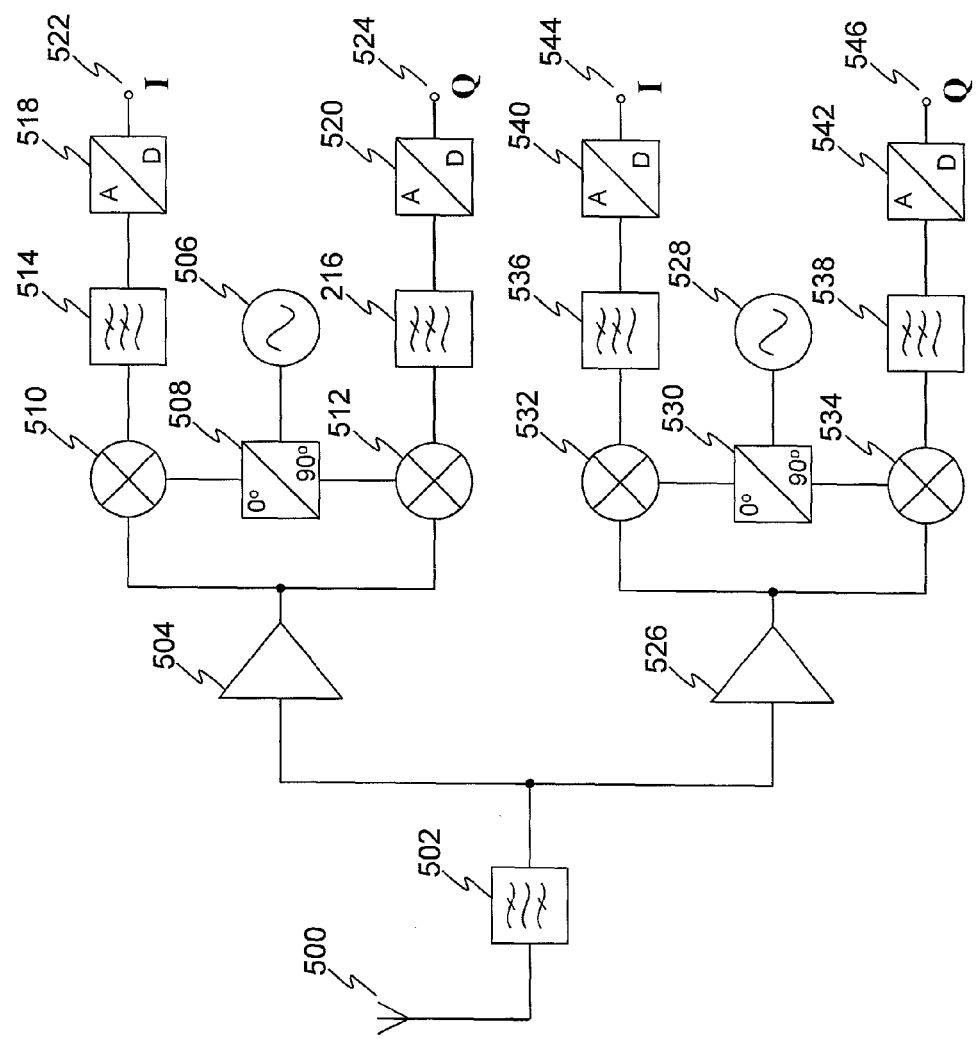
FIG. 5 schematically illustrates an alternative known hardware arrangement for receiving data transmitted via two adjacent signals having a relative signal strength imbalance.

When the signal strength of the received signals is similar, the local oscillator is configured to operate at a frequency that is substantially halfway between the carrier frequencies of the two received signals. Under this mode of operation, the receiver is configured to behave as a low-IF receiver for both signals, and receive the two carrier signals as described previously with relation to FIG. 3. However, when the signal strengths of the incoming signals are relatively dissimilar, the operating frequency of the local oscillator is altered, and the local oscillator is instead configured to operate at a frequency substantially the same as the carrier frequency of one of the received signals.

By varying the operating frequency of a local oscillator, the result of any frequency down-conversion that occurs in the receiver can be tailored to suit any difference in the signal strength of the received signals. Hence, the receiver hardware can be dynamically optimised to receive aggregated signals of differing signal strengths.

Preferably, said local oscillator is configured to operate at said first local oscillator frequency when the signal strength of said first signal and the signal strength of said second signal are relatively similar. In this way, the receiver hardware can be adaptively configured to operate as a low-IF receiver for both carriers when the signal strengths of the two signals are similar enough to allow effective reception of both signals using such an arrangement.

Preferably, said local oscillator is configured to operate at said second local oscillator frequency when the signal strength of said first signal and the signal strength of said second signal are relatively dissimilar. Hence, the receiver can be configured to change the local oscillator frequency to the carrier frequency of one of the signals when the signal strengths of the two signals are not similar enough to allow effective reception of both of the signals using a single receiver path configured to operate as a low-IF receiver for both carriers. In this case, one carrier is received using a low-IF receiver path and the other carrier is received using a direct conversion receiver path.

According to some embodiments, the receiver is further arranged to perform a comparison operation comprising comparing a difference between the signal strength of said first signal and the signal strength of said second signal to a predetermined threshold amount, whereby to generate an output indicative of a relative similarity between the signal strength of said first signal and the signal strength of said second signal. This allows the threshold level to be adapted in order to vary the level of similarity of the signal strengths required in order to configure the local oscillator between operating at the first and second local oscillator frequencies.

The predetermined threshold amount can be defined relative to the signal strength of one or both of said first signal and said second signal. When both signal strengths are low, this enables a lower absolute difference between the signal strengths of the two signals to be used to trigger a change in the frequency produced by the local oscillator, thereby providing a better reflection of the efficacy of using a single direct conversion receiver configuration to receive both signals.

According to further embodiments, the receiver comprises a first receiver path and a second receiver path, said second receiver path having a plurality of operating modes, including at least an inoperative mode. When operating in the inoperative mode, a portion of the receiver can be disabled in order to reduce the power consumption of the receiver.

The local oscillator can be directly connected to the first receiver path and to the second receiver path and configured to operate at one of said first oscillator frequency and said second oscillator frequency in dependence on the output of said comparison operation. By using a single local oscillator for both receiver paths, the effect of local oscillator pulling due to the physical proximity of more than one oscillator generating a similar frequency is avoided. Further, the complexity and silicon area cost associated with the receiver is reduced.

According to some arrangements, the receiver further comprises one or more frequency mixers, at least one said frequency mixer being shared between said first receiver path and said second receiver path. As a result of sharing a local oscillator and input signal, frequency mixers can be shared between the two receiver paths in order to further reduce complexity and silicon area costs.

The receiver may comprise a switch arranged to configure the operating mode of said second receiver path to the inoperative mode, in dependence on the output of said comparison operation. This enables selective blocking of the input signal to the second receiver path, and as a result the power consumption of the receiver can be reduced by removing transient or switching losses associated with the operation of the second path while in the inoperative mode.

According to some arrangements, the switch may be configured to selectively block the output from said shared frequency mixer to said second receiver path, whereby to configure the second receiver path into said inoperative mode. By locating the switching hardware after the output of a shared mixer, a trade off can be made between the reduced cost of the single mixer stage, and the increased cost of duplicated switching hardware.

The receiver may be configured to selectively isolate said second receiver path from an electrical power source, whereby to configure the second receiver path into the inoperative mode, in dependence on the output of said comparison operation. By removing power from the second receiver path when it is inoperative, the baseline power consumption associated with the second receiver path can be reduced. This provides further power savings.

In some embodiments, in the event that the operating mode of the second receiver path is an operative mode, the receiver is arranged to adaptively alter a first gain associated with the first receiver path, and to adaptively alter a second gain associated with the second receiver path in dependence on the signal strength of the first signal and the signal strength of the second signal. Hence the difference in the signal strength of the two signals can be compensated by the independently configurable gains of each path before subsequent signal processing is performed.

The first receiver path may comprise a low pass filter for selecting one of said first and second signals, and said second receiver path comprises a band pass filter for selecting the other of said first or second signals. By configuring the receiver to convert the frequency of the two signals to different low-frequencies, the translated signals will not overlap and the two signals can then be isolated by the first and second receiver paths using filters with different filter profiles. An appropriate band pass filters may also utilise complex signal handling to provide better I/Q performance.

Preferably, one or more of an antenna, a radio-frequency amplifier and a radio-frequency filter are shared between said first receiver path and said second receiver path. As further advantage of using the same local oscillator and input signal for both receiver paths, front end hardware which is typically optimised for a specific range of inputs and operating frequencies may be shared between the two receiver paths, thereby further reducing hardware costs.

Preferably, said first local oscillator frequency is substantially halfway between said first carrier frequency and said second carrier frequency. Hence, when the signal strengths of the two signals are similar, the signals may be reflected on top of each other when down-converted to baseband frequency without either signal substantially overpowering the other, thereby allowing both signals to be processed using a single receiver path with finite IQ performance acting as a low-IF receiver for both signals.

According to other arrangements of the disclosure, said second local oscillator frequency is determined in dependence on the signal strength of the first signal relative to the signal strength of the second signal. Preferably, said second local oscillator frequency is configured to a first second local oscillator frequency value when the signal strength of said first signal is relatively low and the signal strength of said second signal is relatively high, and a second second local oscillator frequency value when the signal strength of said first signal is relatively high and the signal strength of said second signal is relatively low. Hence, the second local oscillator frequency may be set to the carrier frequency of either the first or second signals, dependent on which of the received signals is more powerful.

According to some arrangements, said first second local oscillator frequency value is substantially the same as said first carrier frequency, and said second second local oscillator frequency value is substantially the same as said second carrier frequency. In this way, the second receiver path may be optimised to process the relatively high powered signal and relatively wide operating modes, thereby reducing the requirements that must be met when selecting the second receiver path hardware in terms of gain, filter selectivity etc. In particular, this alleviates the dependence of the second receiver path on large capacitors, further reducing the costs of the additional second receiver path circuitry.

According to alternative arrangements, said first second local oscillator frequency value is substantially the same as said second carrier frequency, and said second second local oscillator frequency value is substantially the same as said first carrier frequency. This enables the second receiver path to be optimised to process the relatively low powered signal, enabling the selection of the second receiver path hardware specifically tailored to process low powered signals.

Preferably, said first carrier frequency and said second carrier frequency are associated with adjacent channels in a communication scheme associated with one or more of said first signal and said second signal. Hence, the complexity of the receiver and any shared front end hardware can be minimised as a narrower range of radio frequencies need to be simultaneously received. In situations that require the use of a second receiver path used, the low frequency to which the associated signal is translated is also advantageously lowered.

Figure 6:
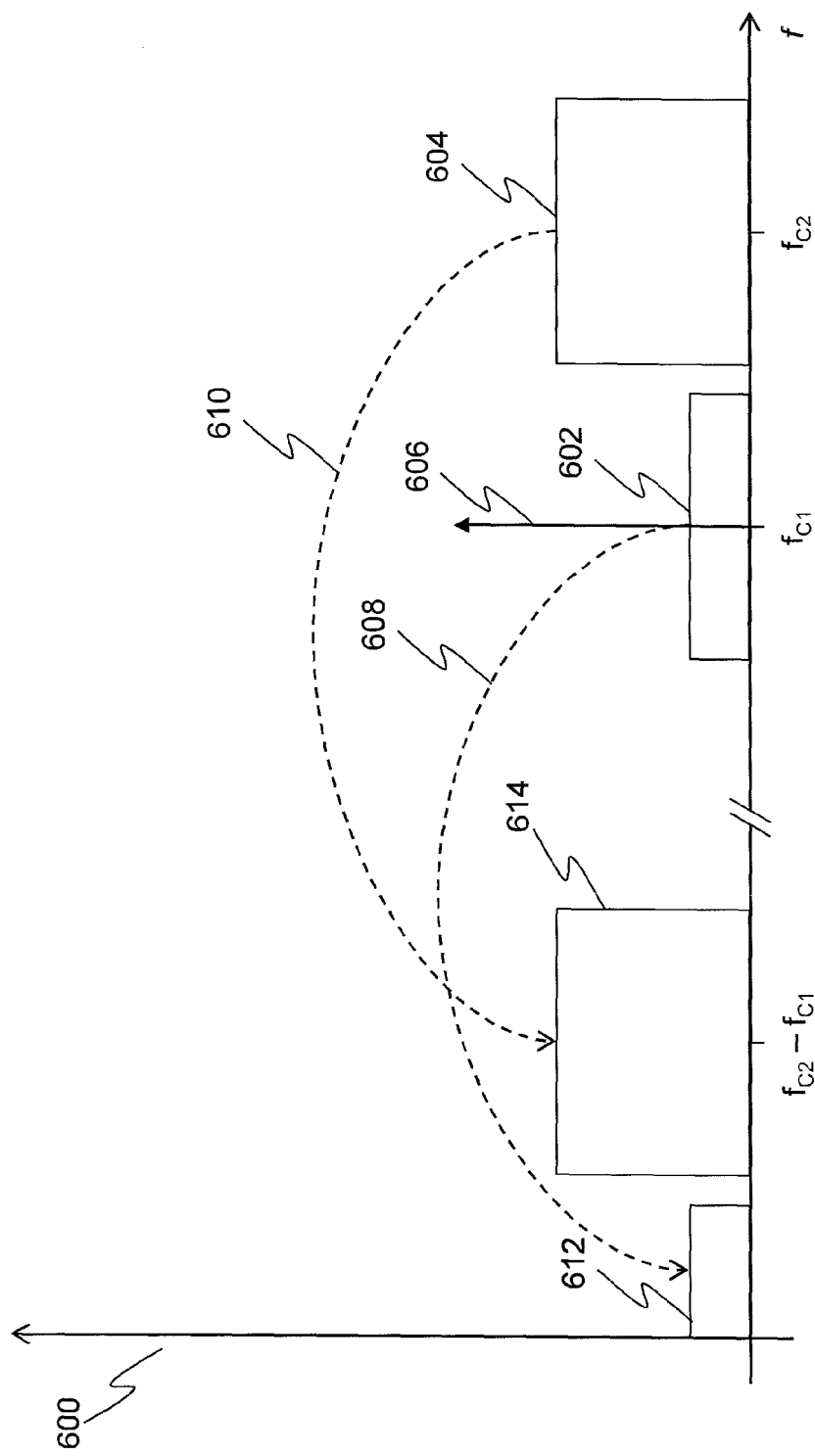
FIG. 6 shows a frequency-amplitude graph illustrating the operation of a receiver according to embodiments of the disclosure.

FIG. 6 illustrates on frequency amplitude graph 600 the operation of a receiver according to embodiments of the disclosure when used to receive data transmitted via two adjacent signals having a relative signal strength imbalance. Adjacent signals 602 and 604 are modulated at carrier frequencies $f_{C1}$ and $f_{C2}$ respectively; however when received at the receiver, the signal strength of signal 602 is significantly lower than the signal strength of signal 604. Due to the signal strength imbalance, the local oscillator is reconfigured to produce local oscillator signal 606 at the carrier frequency of signal 602 ($f_{C1}$). When the input is mixed with local oscillator signal 606, the received signals 602 and 604 are frequency down-converted. Since the local oscillator signal 606 has frequency $f_{C1}$, signal 602 is translated to be centred on zero frequency as shown by arrow 608 and translated signal 612. As explained previously, signal 604 will be translated to be centred on frequency $f_{LO}-f_{C1}$, which is equal to $f_{C2}-f_{C1}$ in the current circumstances, as shown by arrow 610 and translated signal 614. The result of this configuration is that signals 602 and 604 are both frequency down-converted (to around zero frequency and low (IF) respectively) but the translated signals 612 and 614 do not overlap, and hence the problems arising out of signal 614 overpowering signal 612 are avoided.

Translated signal 612 is centred on zero frequency and hence is suitable for processing using a DCR arrangement. Advantageously, this means that the same hardware used to process both signals when the signal strength of the received CA signals is similar, can be used in this configuration to process signal 612 with minimal adaption. Translated signal 614 however is not centred on zero frequency, and hence cannot be isolated using a DCR arrangement. In order to process translated signal 614, an additional receiver path is required. Alternatively, a conventional low-pass receiver architecture with a wide bandwidth and high signal separation capabilities could perform signal isolation in the digital domain; however this would require the ADC resolution to be sufficient to receive all channels passing analog filtering at different power levels simultaneously, which would require more expensive ADC components and is a less optimised use of the provisioned hardware.

Figure 1:
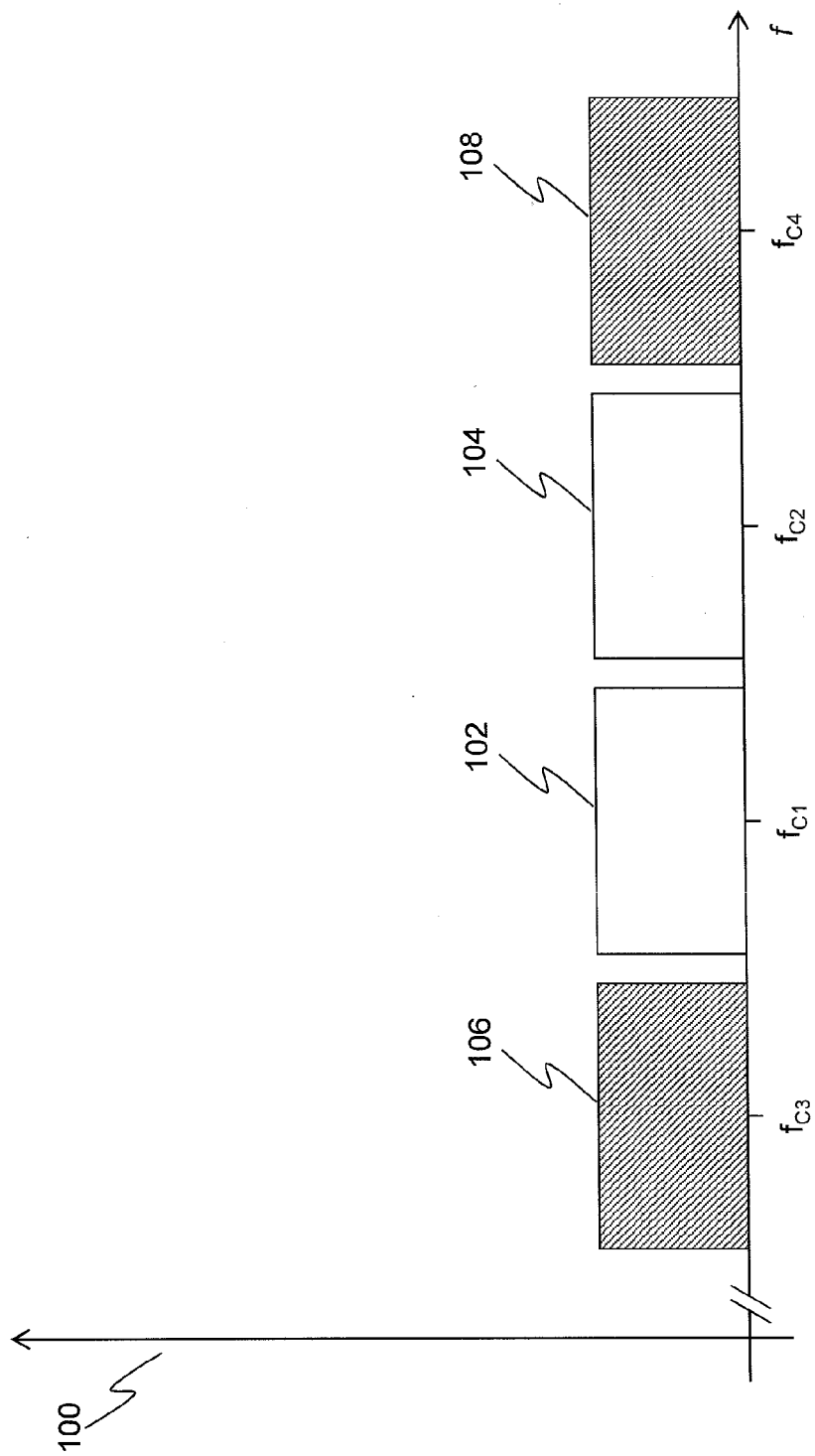
FIG. 1 shows a frequency-amplitude graph illustrating two variations of carrier aggregation.
Figure 2:
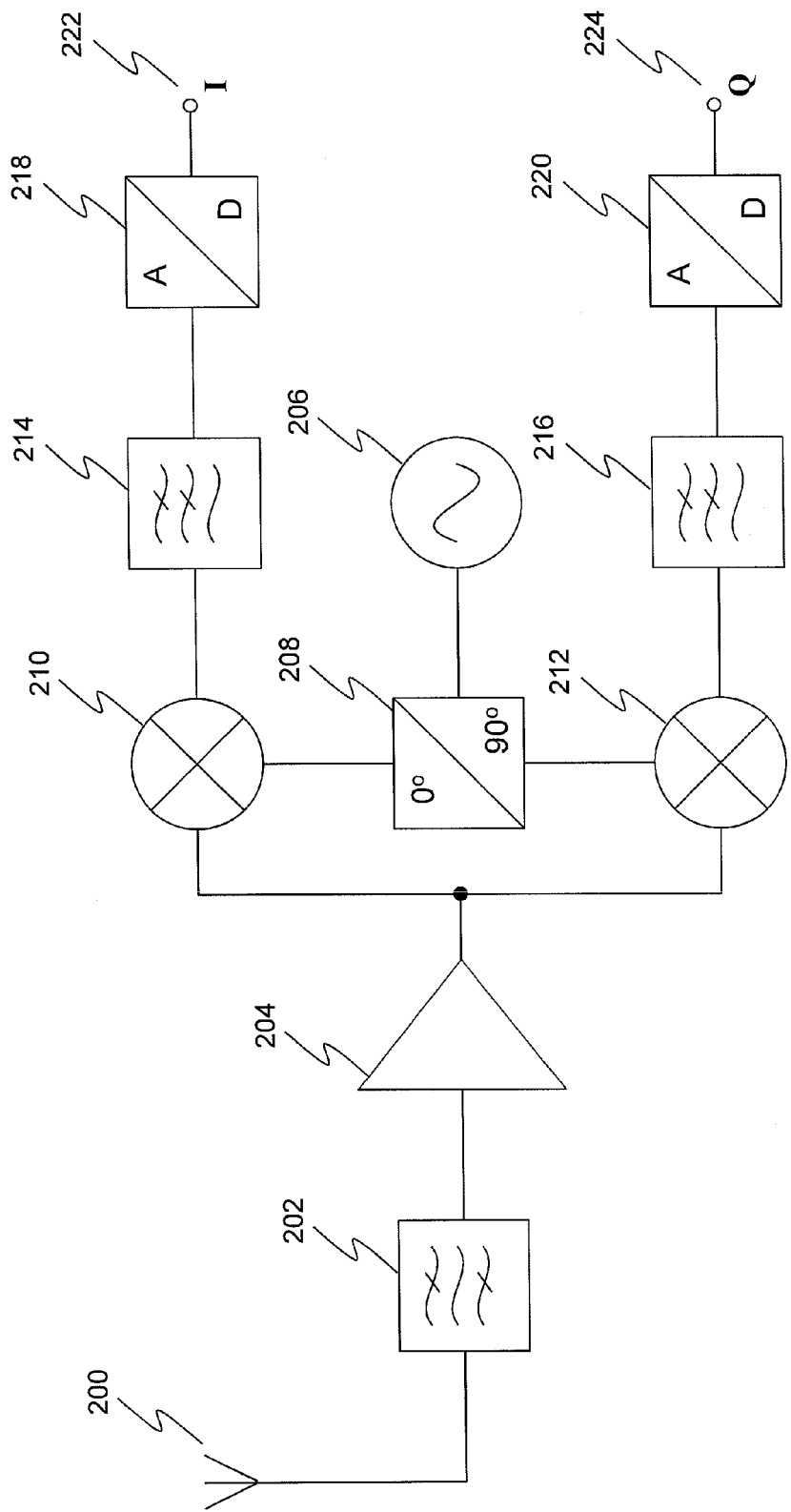
FIG. 2 schematically illustrates an exemplary DCR as known in the art.
Figure 7:
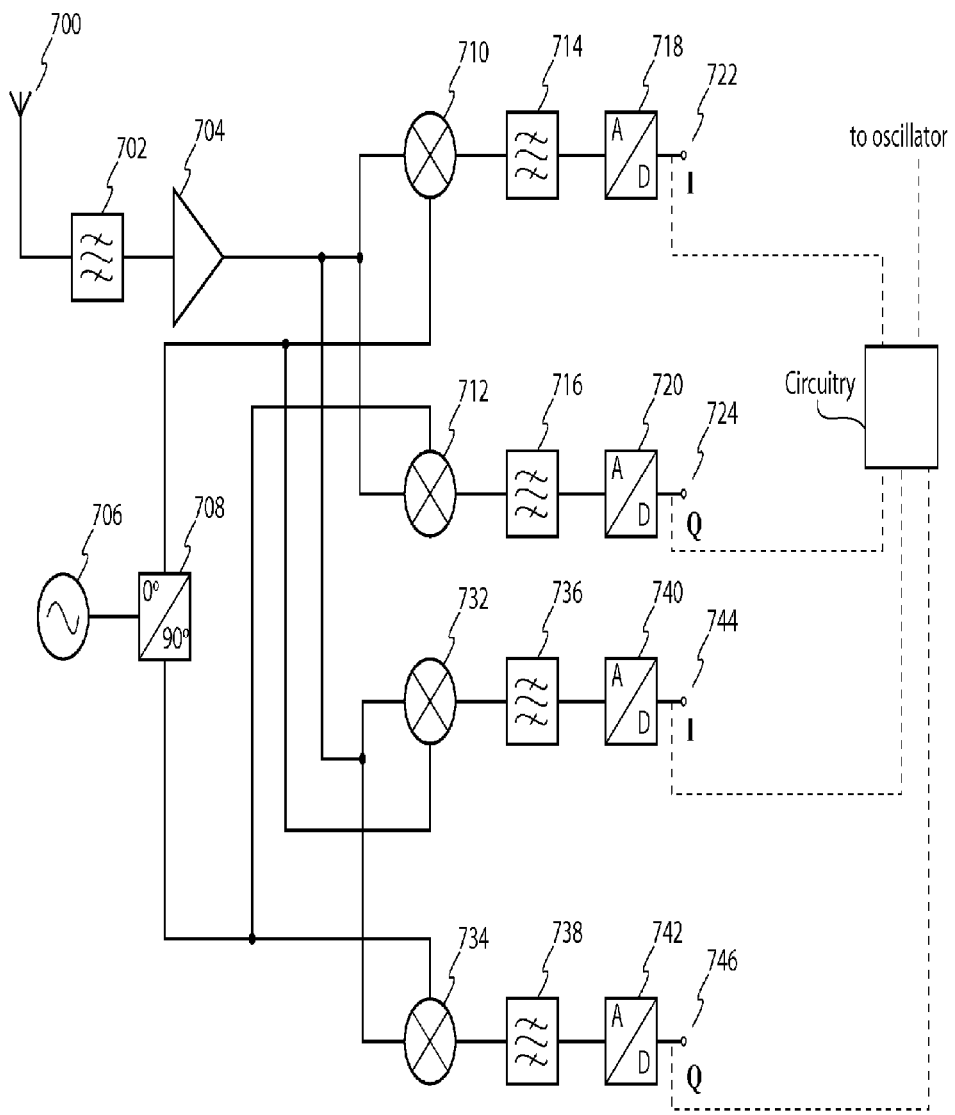
FIG. 7 schematically illustrates an exemplary receiver according to embodiments of the disclosure.

FIG. 7 schematically illustrates an exemplary receiver according to embodiments of the disclosure. According to these embodiments, a single local oscillator is shared between the two available receiver paths. A first receiver path contains antenna 700; pre-selection filter 702; low-noise amplifier 704; local oscillator 706; quadrature generator 708; mixers 710 and 712; low-pass filters 714 and 716; and ADCs 718 and 720. A second receiver path contains antenna 700; pre-selection filter 702; low-noise amplifier 704; local oscillator 706; quadrature generator 708; mixers 732 and 734; band-pass filters 736 and 738; and ADCs 740 and 742. The operation of antenna 700; pre-selection filter 702; low-noise amplifier 704; quadrature generator 708; mixers 710, 712, 732 and 734; low-pass filters 714 and 716; and ADCs 718, 720, 740 and 742; are the same as described previously in relation to FIG. 2. Local oscillator 706 is configured to operate at a frequency that is dependent on the relative signal strengths of the received signals as described above with reference to FIG. 6. The signal generated by local oscillator 706 is utilised by both receiver paths.

The first receiver path is configured to operate as a DCR, and in this manner is capable of processing two contiguous CA signals when the signal strengths of the signals are similar, or a single signal when the signal strengths of the signals are not similar, as described above in relation to FIG. 6. In order to effectively operate under both of the circumstances, the filter profiles of low pass filters 714 and 716 may be adjusted in order to reflect the lower corner frequency required when processing a smaller aggregate bandwidth. The first receiver path may operate as a general purpose receiver path, capable of receiving signals transmitted according to several communication schemes, in which case the hardware of the first receiver path may be further adaptable in order to ensure effective operation with these schemes.

When the signal strengths of the two signals are not similar, the receiver of utilises the second receiver path in order to process the signal that is not translated around zero frequency (also referred to as the low IF signal). The second receiver path includes band-pass filters 736 and 738 which are used to isolate the low IF signal from any adjacent unwanted frequency components. Otherwise, the operation of the second receiver path components is equivalent to those of the first receiver path.

By sharing local oscillator 706 between both receiver paths, the problem of local oscillator pulling, which arises when synthesising two similar frequencies in close physical proximity, is advantageously avoided. Further, by using the same input signal and local oscillator frequency for both receiver paths, front end hardware such as pre-selection filter 702 and low noise amplifier 704 can be effectively shared between both receiver paths due to the equivalent front end requirements of both paths.

The two receiver paths may each include a variable amplification stage (not shown) in order to adjust the amplitude of the two signals in order to match the dynamic range of the ADC hardware and hence maximise the resolution of the conversion into the digital domain. The relative gains of these variable amplification stages may be configured to be proportional to the signal strengths of the two CA signals in order to compensate for the difference in signal strengths when received at the receiver. Such amplification may be provided by amplifier circuitry such as operational-amplifiers or the like.

A further advantage of the receiver depicted in FIG. 7 is that the second receiver path is used only in carrier aggregation scenarios, and hence does not need to meet the same set of requirements as the more general purpose first receiver path. As a result, the specification of the hardware components of the second receiver path is, in most cases, less strict than that of the first path, making the addition of the second receiver path less expensive than might be expected. Further, it is known that the second receiver path will support wider bandwidths, and that the signal processed by the second receiver path will have relatively higher signal strength than at least one of the neighbouring signals, thereby further relaxing the specification of the second receiver path.

The similarity of the signal strengths of the received signals may be assessed in the digital domain on the basis of the received signal strength (RSS) measurements associated with each received signal. Calculating RSS measurements is a common step in known receiver architectures, and the determined value is conventionally used to calibrate amplification stages. In order to prevent signals with high peak to average signal strength ratios from causing rapid fluctuation in the determined RSS parameter, a finite integration time may be included in the calculation. The calculated RSS values may then be subtracted in order to calculate the magnitude and sign of the difference between the signal strengths.

Alternatively, the similarity of the signal strengths of the received signals may be determined by additional comparator hardware comprised within the receiver. A measured signal strength of the first signal may be subtracted from a measured signal strength of the second signal, for example using an operational amplifier comparator arranged in linear mode, in order to determine the magnitude and sign of the difference between the signal strengths. In order to determine whether the signal strengths are sufficiently dissimilar to require the use the second receiver path, the magnitude of the difference identified may be compared to a predetermined threshold level by performing a further comparison operation. This comparison operation could entail a further calculation in the digital domain in the case where signal strength is assessed in the digital domain, or for example by using a transistor switch comparator in the case of the alternative analogue arrangement, in order to determine whether the magnitude has exceeded the threshold level.

According to some embodiments, the threshold level may be adapted in order to vary the strictness of the determination of similarity. For example the threshold level may be lowered in order to reduce the difference in signal strengths required before the second receiver path is used. This advantageously allows the threshold level to be determined relative to a signal strength of one of the received CA signals. For example the threshold level may be configured to represent a certain percentage of the signal strength of the strongest signal, thereby requiring a smaller absolute signal strength difference when both of the signals are received with a relatively low signal strength, as compared to when both of the signals are received with a relatively high signal strength. Further, the threshold level may be configured to introduce hysteresis into the comparison in order to prevent rapid switching between outputs when the difference in signal strengths is fluctuating around the threshold level.

The output of this comparison can be used directly by the receiver to determine whether the local oscillator should operate at the first frequency (halfway between the first and second carrier frequencies) or at the second frequency (the carrier frequency of one of the received CA signals).

As the second receiver path is only utilised when the signal strengths of the two receiver CA signals are determined to be different, the second receiver path may be configured into an inoperative state when not required. By disabling the second receiver path in this manner, power savings may be made.

Figure 8:
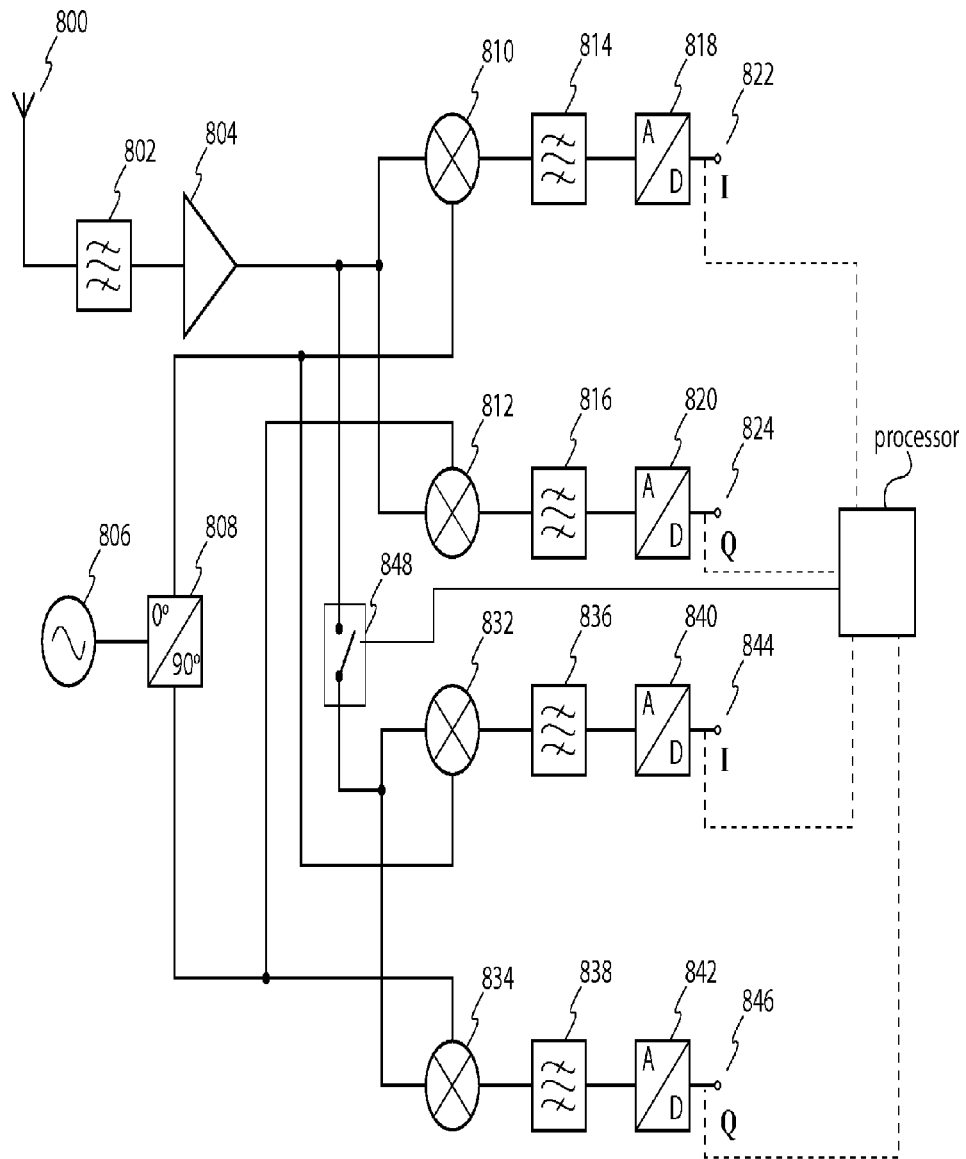
FIG. 8 schematically illustrates an alternative exemplary receiver according to embodiments of the disclosure.

FIG. 8 schematically illustrates a receiver according to a further embodiment; in this arrangement the receiver includes means for configuring the second receiver path into an inoperative state. The operation of antenna 800; pre-selection filter 802; low-noise amplifier 804; local oscillator 806; quadrature generator 808; mixers 810, 812, 832 and 834; low-pass filters 814 and 816; band pass filters 836 and 838; and ADCs 818, 820, 840 and 842; are the same as described previously in relation to FIG. 7. However, switch 848 has been introduced on the second receiver path just after the fork between the first and second receiver paths. Switch 848 may, for example, be a transistor switch, configurable to selectively block the received input from reaching the subsequent components of the second receiver path thereby rendering the second receiver path inoperable. By blocking the signal in this way, transient and switching power consumption associated with the operation of the subsequent receiver components is reduced, thereby improving the power efficiency of the receiver.

In alternative embodiments, the DCR comprises receiver power control hardware (not shown) configured to isolate the subsequent components of the second receiver path from the receiver's power supply in order to comprehensively minimise the additional power consumption attributable to the second receiver path.

The state of switch 848 and the aforementioned receiver power control hardware may be controlled by the output of the signal strength comparison calculations (or the alternative comparator hardware arrangement) described previously such that the second receiver path hardware is configured into the inoperative state automatically when the signal strengths of the two received CA signals are determined to be different.

In the embodiment shown in FIG. 8, the input signal is split between the first receiver path and the second receiver path downstream of the low-noise amplifier. However, in an alternative arrangement (not shown), the input signal may be split within the low-noise amplifier 804: for example in arrangements in which the low-noise amplifier 804 comprises an input stage and a cascode stage, the signal could be split before the cascode stage, while for a low-noise amplifier 804 that comprises more than two stages, the split could be configured between two of the later stages.

Figure 9:
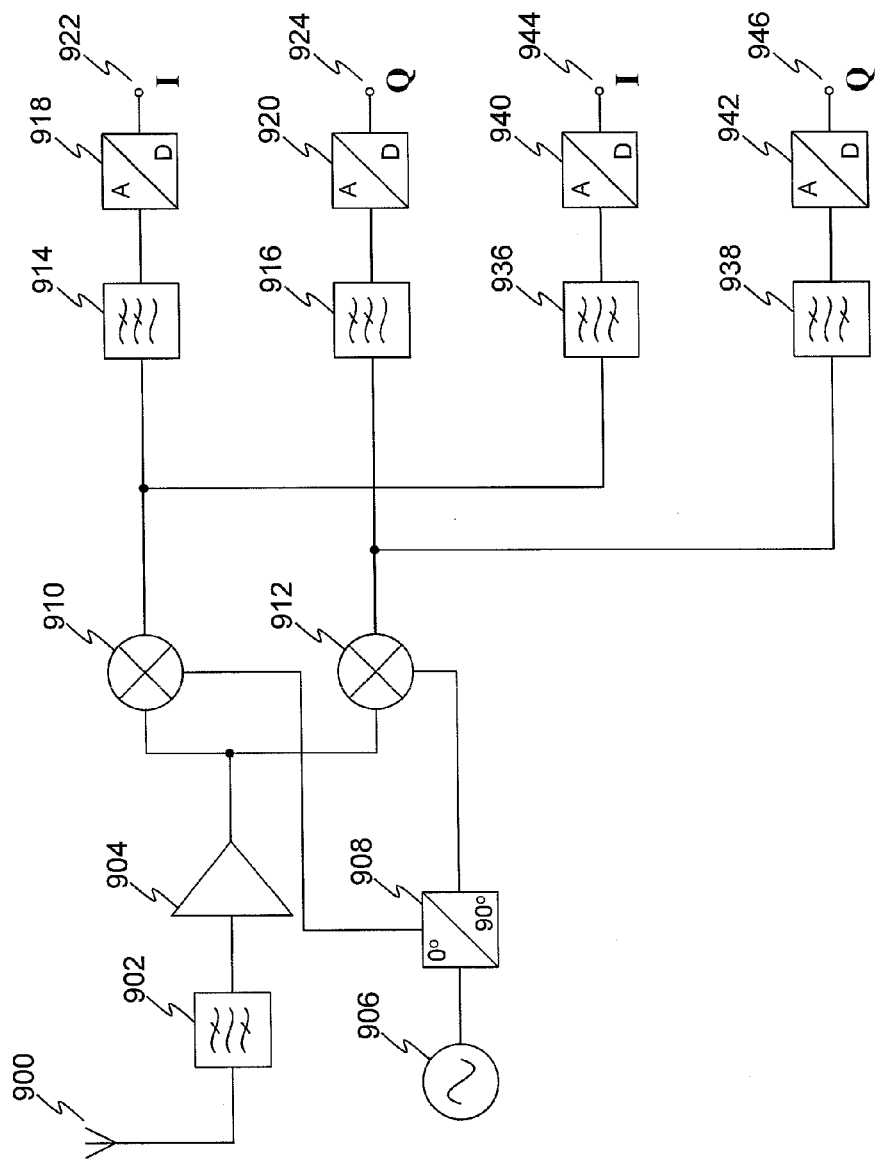
FIG. 9 schematically illustrates a further alternative exemplary receiver according to embodiments of the disclosure.

As a result of using the same input and local oscillator signal for both receiver paths, further hardware can be shared between the two paths. FIG. 9 schematically illustrates a receiver according to an embodiment wherein mixer hardware is shared between the two receiver paths. The operation of antenna 900; pre-selection filter 902; low-noise amplifier 904; local oscillator 906; quadrature generator 908; mixers 910 and 912; low-pass filters 914 and 916; band pass filters 936 and 938; and ADCs 918, 920, 940 and 942; are the same as described previously in relation to FIG. 8. However, the fork between the first and second receiver paths is now positioned after the output of mixers 910 and 912. As a result of sharing additional hardware components between the two receiver paths, additional power consumption and silicon area cost savings can be made. Alternatively, if the resolution of ADC is sufficiently high, it may be possible to perform the signal separation in the digital domain and hence the fork and final filtering arrangements can be moved entirely into the subsequent processing stages.

Figure 10:
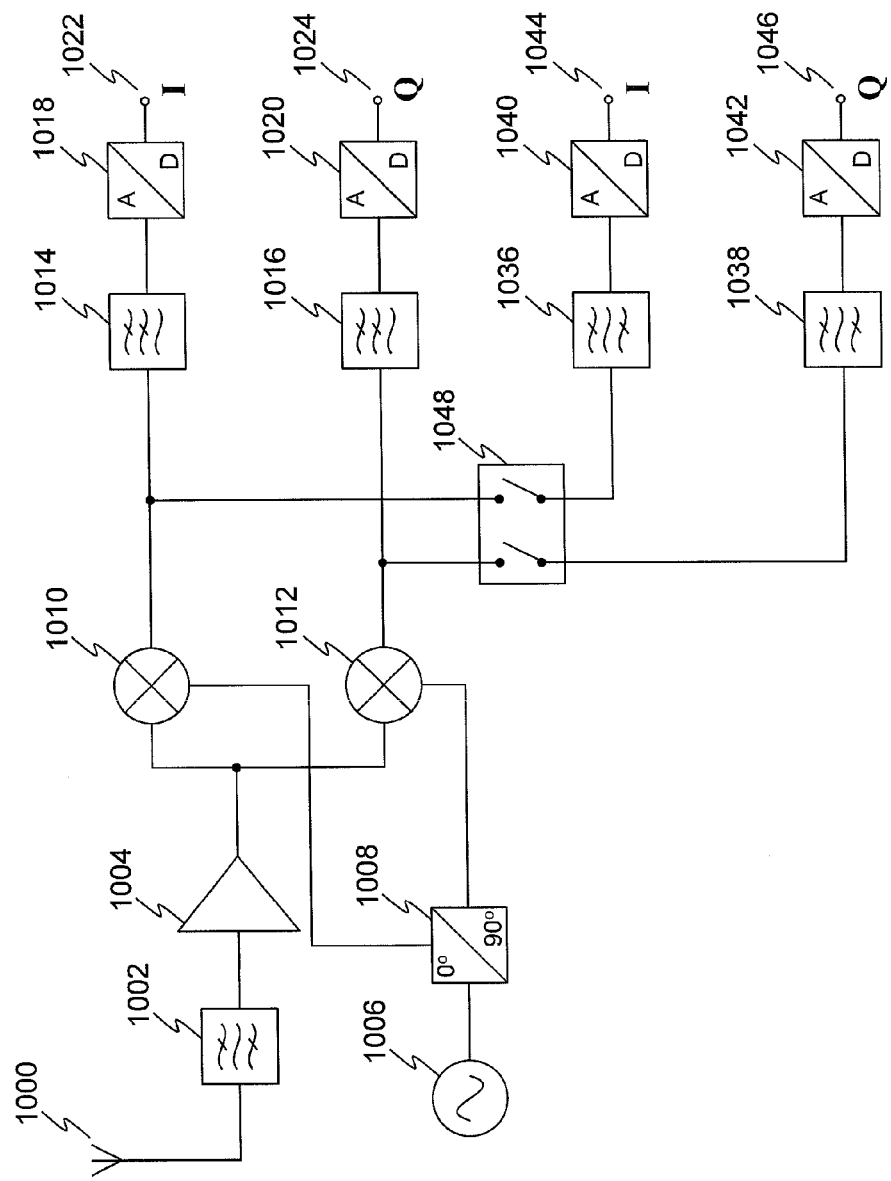
FIG. 10 schematically illustrates a yet further alternative exemplary receiver according to embodiments of the disclosure.

FIG. 10 schematically illustrates a further receiver according to an embodiment, wherein mixer hardware is shared between the two receiver paths and the second receiver path may be configured into an inoperative state. The operation of antenna 1000; pre-selection filter 1002; low-noise amplifier 1004; local oscillator 1006; quadrature generator 1008; mixers 1010 and 1012; low-pass filters 1014 and 1016; band pass filters 1036 and 1038; and ADCs 1018, 1020, 1040 and 1042; are the same as described previously in relation to FIG. 9. However, switching hardware 1048 has been introduced on the second receiver path just after the fork between the first and second receiver paths. Since the fork between the first and second receiver paths consists of two channels, the switching hardware required to selectively block the signal from reaching the subsequent components of the second receiver path is of slightly greater complexity than the equivalent switching hardware described previously in relation to FIG. 8. However, when the receiver includes the aforementioned isolating receiver power control hardware described above, the complexity of the power control hardware is not increased, and indeed may even be reduced as a result of the fewer subsequent hardware components in the second receiver path.

It is to be noted that, depending on the low-noise amplifier 804 and the subsequent down-conversion mixer topologies, the interface between these components can be configured in ways other than those shown in FIGS. 7-10.

Until now, the operation of the receiver has been described according to the signals illustrated in FIG. 6, i.e. where the lower frequency carrier signal is of relatively lower signal strength. However, embodiments can be used when the lower frequency carrier signal is of relatively higher signal strength.

Figure 11:
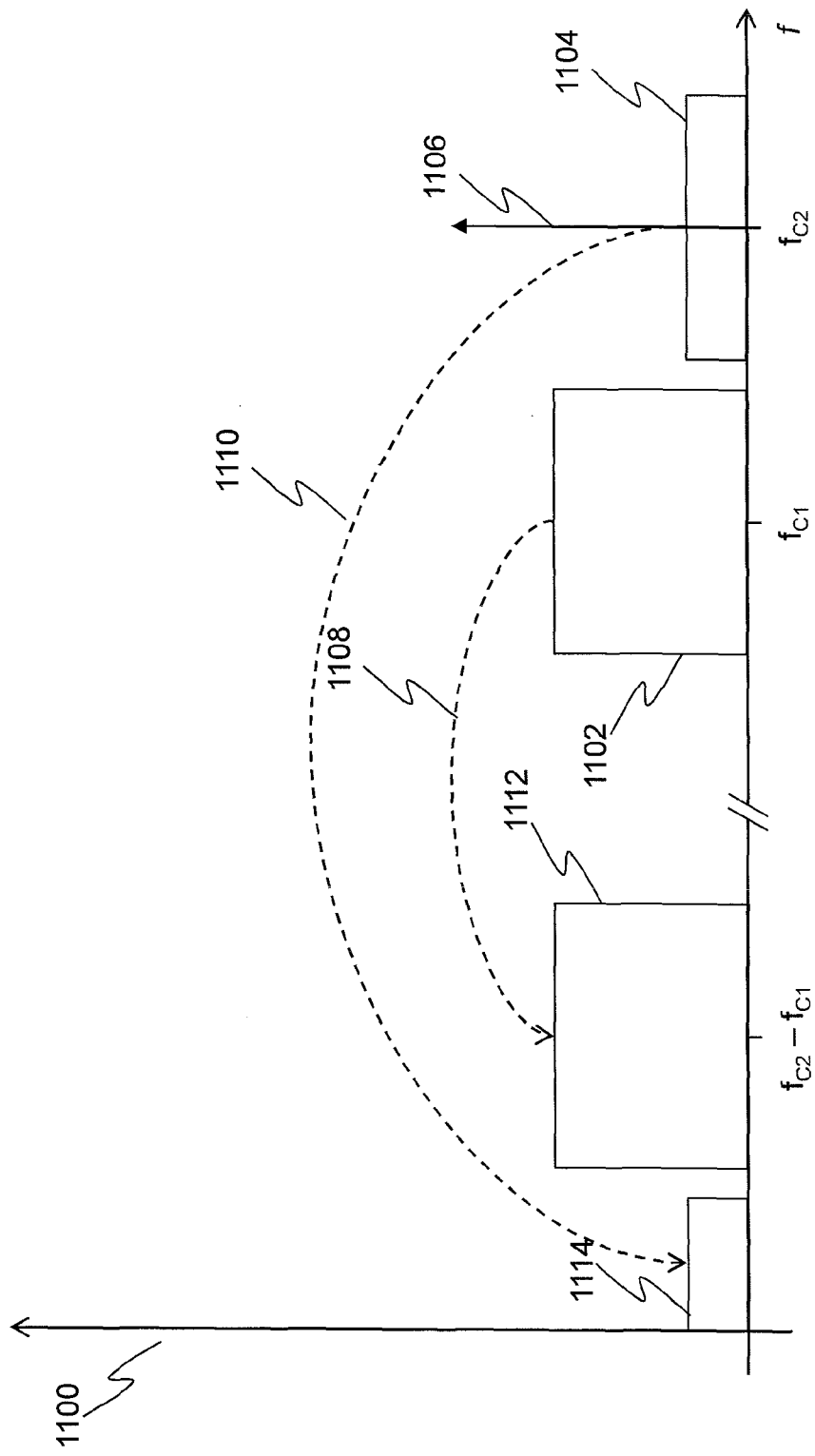
FIG. 11 shows a frequency-amplitude graph illustrating the operation of a receiver according to embodiments of the disclosure.

FIG. 11 illustrates on frequency amplitude graph 1100 the operation of a receiver according to embodiments when used to receive data transmitted via two adjacent signals having an inverse signal strength imbalance compared to that shown in FIG. 6. Adjacent signals 1102 and 1104 are modulated at carrier frequencies $f_{C1}$ and $f_{C2}$ respectively; however when received at the receiver, the signal strength of signal 1102 is significantly higher than the signal strength of signal 1104. Due to the signal strength imbalance, the local oscillator is reconfigured to produce local oscillator signal 1106 at the carrier frequency of signal 1104 ($f_{C2}$). When the input is mixed with local oscillator signal 1106, the received signals 1102 and 1104 are frequency down-converted. Since the local oscillator signal 1106 has frequency $f_{C2}$, signal 1104 is translated to be centred on zero as shown by arrow 1110 and translated signal 1114. As explained previously, signal 1102 is translated to be centred on frequency $f_{LO}-f_{C1}$, which is equal to $f_{C2}-f_{C1}$ in the current circumstances, as shown by arrow 1108 and translated signal 1112. The result of this configuration is that signals 1102 and 1104 are both frequency down-converted (to low IF and around zero frequency respectively) but the translated signals 1112 and 1114 do not overlap, and hence the problems arising out of signal 1112 overpowering signal 1114 are again avoided.

Additionally, until now, the operation of the receiver has involved the local oscillator being configured to operate at the carrier frequency of the weaker of the two received CA signals when the signal strengths of the two received signals are determined to be relatively dissimilar. This has the advantage of ensuring that the second receiver path is always responsible for processing the signal with the relatively higher signal strength, thereby relaxing the requirements on the second path and allowing the cost of selecting components for that path to be reduced. An alternative is to ensure that the second receiver path is always responsible for dealing with the weaker signal by configuring the local oscillator to always operate at the carrier frequency of the stronger of the two received CA signals when the signal strengths of the two received signals are determined to be relatively dissimilar. This allows the second path to be optimised for receiving low strength signals, thereby providing an opportunity to increase the performance of the receiver under such conditions through careful component selection.

Alternatively, the choice of which signal to be received on each of the two receiver paths may be determined on the basis of signal interference scenarios. By optimising one of the receiver paths for the processing of signals that are received with significant interference, a careful signal analysis may result in the selection of a different carrier frequency in the case of a power imbalance that is outweighed by the effects of substantial interference.

Whilst the above embodiments relate to Carrier Aggregation for LOng Term Evolution (LTE), it will be appreciated that the invention applies to Carrier Aggregation for other, different, radio access technologies such as the aforementioned or High Speed packet Access (HSPA). Furthermore, the invention applies to intra-band Carrier Aggregation, in which a user equipment receives carrier frequencies originating from radio access nodes operating in accordance with different radio access technologies, such as is the case for intra-band HSPA-LTE Carrier Aggregation.

In various embodiments an apparatus comprising the aforementioned receiver hardware may be a user terminal, or one or more components thereof such as for example a wireless modem configured for use in a user terminal.

Figure 12:
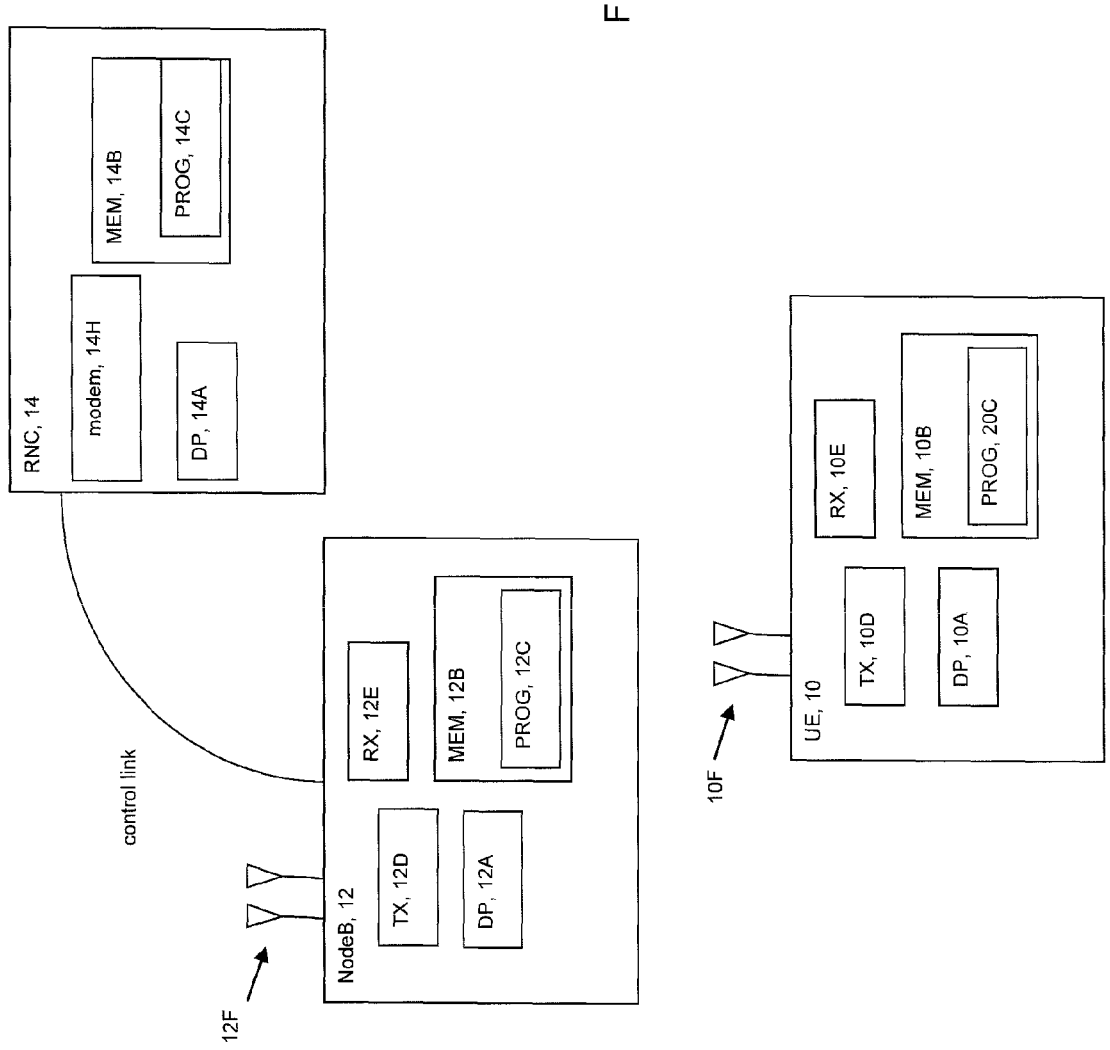
FIG. 12 is a simplified block diagram of various network devices and a user terminal which may include the receiver hardware shown in FIGS. 7-10.

Reference is now made to FIG. 12 for illustrating a simplified block diagram of various electronic devices and apparatus that are suitable for use in practicing the exemplary embodiments of this invention. In FIG. 12 a serving cell/network access node 12 is adapted for communication over a wireless link with a mobile apparatus, such as a mobile terminal or UE 10. The network access node 12 may be a NodeB as identified at FIG. 12, an eNodeB (of an E-UTRAN system), an access point AP, a remote radio head or relay station, or other type of base station/cellular access node.

The UE 10 includes processing means such as at least one data processor (DP) 10A, storing means such as at least one computer-readable memory (MEM) 10B storing at least one computer program (PROG) 10C, and also communicating means such as a transmitter TX 10D and a receiver RX 10E configured according to embodiments of the invention for bidirectional wireless communications with the network access node 12 via one or more antennas 10F.

The network access node 12 similarly includes processing means such as at least one data processor (DP) 12A, storing means such as at least one computer-readable memory (MEM) 12B storing at least one computer program (PROG) 12C, and communicating means such as a transmitter TX 12D and a receiver RX 12E for bidirectional wireless communications with the UE 10 via one or more antennas 12F. The RNC 14 represents any other higher network node or serving gateway providing connectivity to a broader network (a publicly switched telephone network or the Internet for example), and some systems may not have such a higher network node between the access node 12 and the Internet.

Similarly, the RNC 14 includes processing means such as at least one data processor (DP) 14A, storing means such as at least one computer-readable memory (MEM) 14B storing at least one computer program (PROG) 14C, and communicating means such as a modem 14H for bidirectional communication with the network access node 12 via the control link.

It will be understood that the various embodiments of the receiver 10E described herein comprise circuitry that may be provided by a single chip or integrated circuit or plural chips or integrated circuits, optionally provided as a chipset, an application-specific integrated circuit (ASIC), field-programmable gate array (FPGA), etc. The chip or chips may comprise circuitry (as well as possibly firmware) for embodying at least one or more of the aforementioned components, including control circuitry, digital signal processor or processors, baseband circuitry and radio frequency circuitry, which are configurable so as to operate in accordance with the exemplary embodiments. In this regard, the exemplary embodiments may be implemented at least in part by computer software stored in memory and executable by a processor, or by hardware, or by a combination of tangibly stored software and hardware (and tangibly stored firmware).

Figure 13:
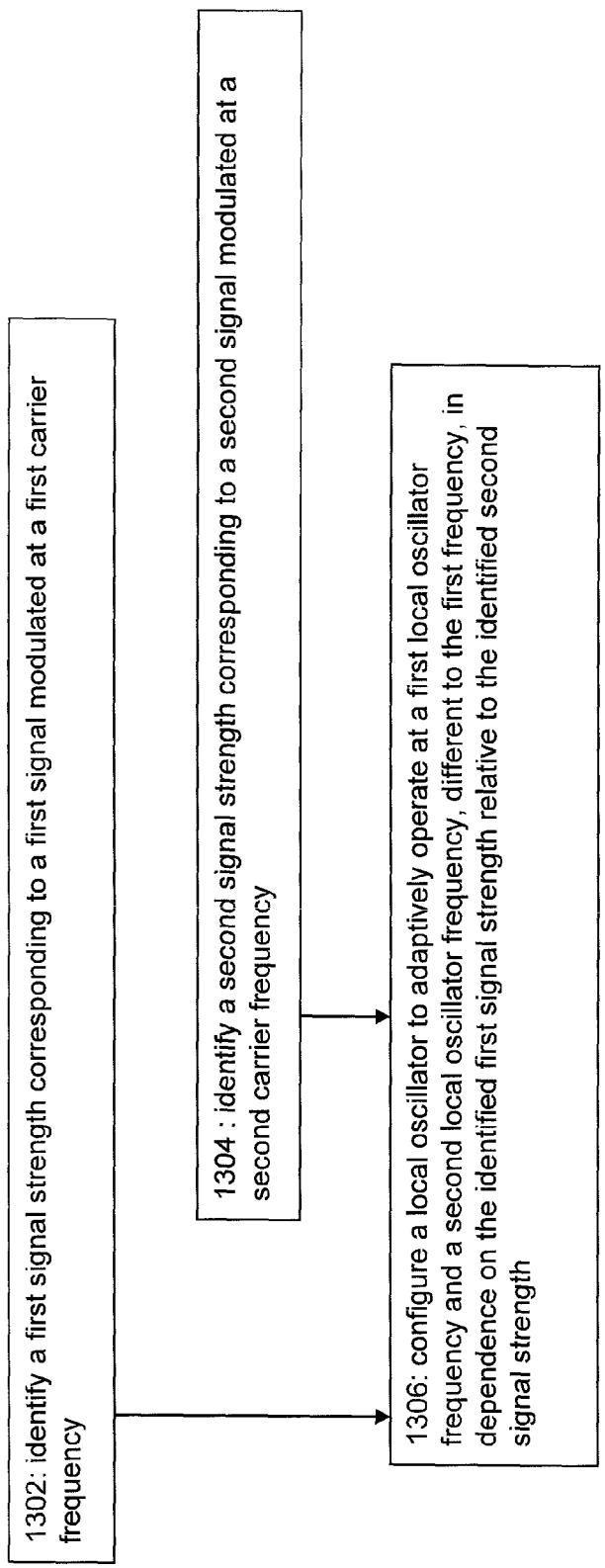
FIG. 13 is a logic flow diagram that illustrates the steps involved in configuring a receiver according to an embodiment of the disclosure.

FIG. 13 is a logic flow diagram that describes an exemplary embodiment of the invention from the perspective of the UE 10, and in this regard, the Figure represents steps performed by one or a combination of the aforementioned control circuitry, digital signal processor or processors, baseband circuitry and radio frequency circuitry.

At step 1302, the receiver apparatus identifies a first signal strength corresponding to a first signal received from the access point 12, this being a signal modulated at a first carrier frequency. At step 1304, the receiver apparatus identifies a second signal strength corresponding to a second signal also received from the access point 12, this being a signal modulated at a second carrier frequency, different to the first carrier frequency. Then, at step 1306, the receiver apparatus configures a local oscillator to adaptively operate at a first local oscillator frequency and a second local oscillator frequency, different to the first frequency, in dependence on the identified first signal strength relative to the identified second signal strength.

The above embodiments are to be understood as illustrative examples of the invention. Further embodiments of the invention are envisaged. For example, the invention could be worked with communication schemes other than LTE-A, in any scenario where two signals with similar carrier frequencies need to be received simultaneously. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

The invention claimed is:

1. A receiver for receiving data transmitted via a combination of a first signal modulated at a first carrier frequency, and a second signal modulated at a second carrier frequency, different to the first carrier frequency, the receiver comprising a local oscillator and the local oscillator being configured to adaptively operate at a first local oscillator frequency and a second local oscillator frequency, different to the first frequency, in dependence on a signal strength of the first signal relative to a signal strength of the second signal, wherein said first local oscillator frequency is substantially halfway between said first carrier frequency and said second carrier frequency.

2. The receiver according to claim 1, wherein said local oscillator is configured to operate at said first local oscillator frequency when the signal strength of said first signal and the signal strength of said second signal are relatively similar.

3. The receiver according to claim 1, wherein said local oscillator is configured to operate at said second local oscillator frequency when the signal strength of said first signal and the signal strength of said second signal are relatively dissimilar.

4. The receiver according to claim 1, wherein the receiver is further arranged to perform a comparison operation comprising comparing a difference between the signal strength of said first signal and the signal strength of said second signal to a predetermined threshold amount, whereby to generate an output indicative of a relative similarity between the signal strength of said first signal and the signal strength of said second signal.

5. The receiver according to claim 4, wherein the predetermined threshold amount is defined relative to the signal strength of one or both of said first signal and said second signal.

6. The receiver according to claim 4, comprising a first receiver path and a second receiver path, said second receiver path having a plurality of operating modes, including at least an inoperative mode.

7. The receiver according to claim 6, wherein said local oscillator is directly connected to the first receiver path and to the second receiver path and configured to operate at one of said first oscillator frequency and said second oscillator frequency in dependence on the output of said comparison operation.

8. The receiver according to claim 6, further comprising one or more frequency mixers, at least one said frequency mixer being shared between said first receiver path and said second receiver path.

9. The receiver according to claim 6, comprising a switch arranged to configure the operating mode of said second receiver path to the inoperative mode, in dependence on the output of said comparison operation.

10. The receiver according to claim 9, wherein the switch is configured to selectively block an output from said shared frequency mixer to said second receiver path, whereby to configure the second receiver path into said inoperative mode.

11. The receiver according to claim 6, wherein said receiver is configured to selectively isolate said second receiver path from an electrical power source, whereby to configure the second receiver path into the inoperative mode, in dependence on the output of said comparison operation.

12. The receiver according to claim 6, wherein the event that the operating mode of the second receiver path is an operative mode, the receiver is arranged to adaptively alter a first gain associated with the first receiver path, and to adaptively alter a second gain associated with the second receiver path in dependence on the signal strength of the first signal and the signal strength of the second signal.

13. The receiver according to claim 6, wherein said first receiver path comprises a low pass filter for selecting one of said first and second signals, and said second receiver path comprises a band pass filter for selecting the other of said first or second signals.

14. The receiver according to claim 6, wherein one or more of an antenna, a radio-frequency amplifier and a radio-frequency filter are shared between said first receiver path and said second receiver path.

15. The receiver according to claim 1, wherein a second local oscillator frequency is determined in dependence on the signal strength of the first signal relative to the signal strength of the second signal.

16. The receiver according to claim 15, wherein said second local oscillator frequency is configured to a first second local oscillator frequency value when the signal strength of said first signal is relatively low and the signal strength of said second signal is relatively high, and a second second local oscillator frequency value when the signal strength of said first signal is relatively high and the signal strength of said first signal is relatively high and the signal strength of said second signal is relatively low.

17. The receiver according to claim 16, wherein said first second local oscillator frequency value is substantially the same as said first carrier frequency.

18. The receiver according to claim 16, wherein said second second local oscillator frequency value is substantially the same as said second carrier frequency.

19. The receiver according to claim 16, wherein said first second local oscillator frequency value is substantially the same as said second carrier frequency.

20. The receiver according to claim 16, wherein said second second local oscillator frequency value is substantially the same as said first carrier frequency.

21. The receiver according to claim 1, wherein said first carrier frequency and said second carrier frequency are associated with adjacent channels in a communication scheme associated with one or more of said first signal and said second signal.

22. A method of configuring a receiver to receive data transmitted via a combination of a first signal modulated at a first carrier frequency, and a second signal modulated at a second carrier frequency, different to the first carrier frequency, the method comprising:
    identifying a first signal strength corresponding to the first signal;
    identifying a second signal strength corresponding to the second signal; and
    configuring a local oscillator to adaptively operate at a first local oscillator frequency and a second local oscillator frequency, different to the first frequency, in dependence on the identified first signal strength relative to the identified second signal strength, wherein the first local oscillator frequency is substantially halfway between said first carrier frequency and said second carrier frequency.

* * * * *